US010613438B2

(12) United States Patent
Burns et al.

(10) Patent No.: US 10,613,438 B2
(45) Date of Patent: Apr. 7, 2020

(54) SELF-ALIGNED PATTERNING METHODS WHICH IMPLEMENT DIRECTED SELF-ASSEMBLY

(71) Applicant: International Business Machines Corporation, Armonk, NY (US)

(72) Inventors: Sean D. Burns, Hopewell Junction, NY (US); Sivananda K Kanakasabapathy, Pleasanton, CA (US); Kafai Lai, Poughkeepsie, NY (US); Chi-Chun Liu, Altamont, NY (US); Kristin Schmidt, Mountain View, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 15/871,499

(22) Filed: Jan. 15, 2018

(65) Prior Publication Data
US 2019/0221428 A1    Jul. 18, 2019

(51) Int. Cl.
*G03F 7/038* (2006.01)
*H01L 21/033* (2006.01)
(Continued)

(52) U.S. Cl.
CPC ............ *G03F 7/038* (2013.01); *G03F 7/0002* (2013.01); *G03F 7/0045* (2013.01); *G03F 7/16* (2013.01);
(Continued)

(58) Field of Classification Search
CPC ....................................................... G03F 7/16
See application file for complete search history.

(56) References Cited

U.S. PATENT DOCUMENTS 8,361,704 B2 * 1/2013 Colburn .............. B81C 1/00031
430/323
8,656,322 B1    2/2014 Dechene et al.
(Continued)

OTHER PUBLICATIONS

J. Ou et al., "Directed Self-Assembly Based Cut Mask Optimization for Unidirectional Design," Proceedings of the 25th Edition of ACM Great Lakes Symposium on VLSI (GLSVLSI), May 20-22, 2015, pp. 83-86.
(Continued)

*Primary Examiner* — Kathleen Duda
(74) *Attorney, Agent, or Firm* — Vazken Alexanian; Ryan, Mason & Lewis, LLP

(57) ABSTRACT

Lithographic patterning methods are provided which implement directed self-assembly (DSA) of block copolymers to enable self-aligned cutting of features. A first layer and second layer of material are formed on a substrate. The second layer of material is lithographically patterning to form a guiding pattern. A DSA process is performed to form a block copolymer pattern around the guiding pattern, which comprises a repeating block chain that includes at least a first block material and a second block material, which have etch selectivity with respect to each other. A selective etch process is performed to selectively etching one of the first block material and the second block material to form self-aligned openings in the block copolymer pattern which expose portions of the first layer of material. The first layer of material is patterned by etching the exposed portions of the first layer of material.

19 Claims, 10 Drawing Sheets

(51) Int. Cl.
G03F 7/00 (2006.01)
G03F 7/16 (2006.01)
G03F 7/004 (2006.01)
(52) U.S. Cl.
CPC ...... *H01L 21/0332* (2013.01); *H01L 21/0337* (2013.01); *H01L 21/0338* (2013.01)

(56) References Cited

U.S. PATENT DOCUMENTS

| | | | |
|---|---|---|---|
| 2012/0127454 A1 | 5/2012 | Nakamura et al. | |
| 2013/0266727 A1 | 10/2013 | Peeters et al. | |
| 2015/0093702 A1 | 4/2015 | Nyhus et al. | |
| 2015/0332973 A1 | 11/2015 | Zhong et al. | |
| 2016/0251539 A1* | 9/2016 | Hustad | G03F 7/0002 427/385.5 |

OTHER PUBLICATIONS

J. Ou et al., "Directed Self-Assembly Cut Mask Assignment for Unidirectional Design," Journal of Micro/Nanolithography, MEMS, and MOEMS, Jul.-Sep. 2015, 8 pages, vol. 14, No. 3.

J. Cheng et al., "Customization and Design of Directed Self-Assembly Using Hybrid Prepatterns," Proceedings of the SPIE Alternative Lithography Technologies, Mar. 19, 2015, 8 pages, vol. 9423.

G.S. Doerk et al., "Deterministically Isolated Gratings Through the Directed Self-Assembly of Block Copolymers," Proceedings of SPIE Alternative Lithography Technologies, Mar. 26, 2013, 8 pages, vol. 8680.

H. Tsai et al., "Two-Dimensional Pattern Formation Using Graphoepitaxy of PS-b-PMMA Block Copolymers for Advanced FinFET Device and Circuit Fabrication," ACS Nano, May 27, 2014, pp. 5227-5232, vol. 8, No. 5.

C.-C. Liu et al., "Fin Formation Using Graphoepitaxy DSA for FinFET Device Fabrication," Proceedings of SPIE Alternative Lithography Technologies, Mar. 19, 2015, 10 pages, vol. 9423.

C.-C. Liu et al., "DSA Patterning Options for FinFET Formation at 7nm Node," Proceedings of SPIE Alternative Lithography Technologies, Mar. 22, 2016, 15 pages, vol. 9777.

Z.-W. Lin et al., "Cut Redistribution with Directed Self-Assembly Templates for Advanced 1-D Gridded Layouts," Proceedings of the 21st IEEE Asia and South Pacific Design Automation Conference (ASP-DAC), Jan. 25-28, 2016, pp. 89-94.

* cited by examiner

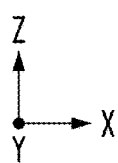
*FIG. 1*
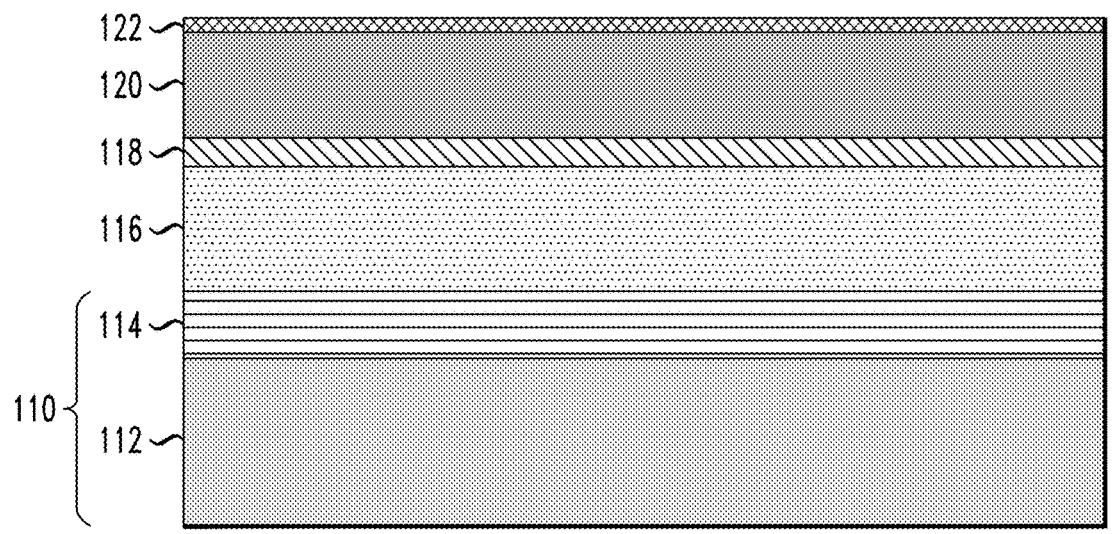
*FIG. 2*
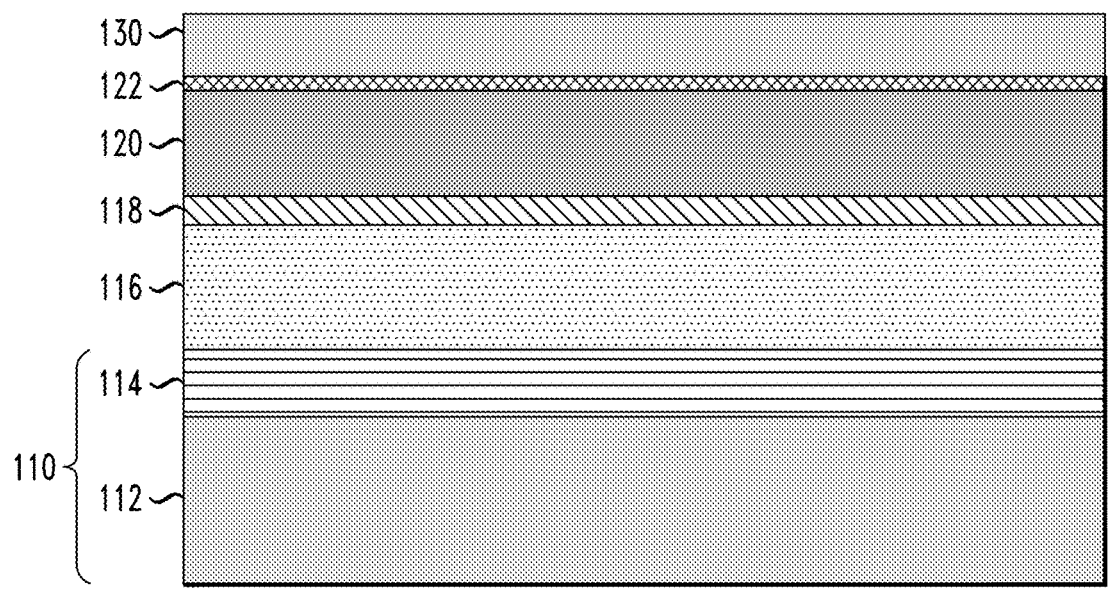

US 10,613,438 B2

SELF-ALIGNED PATTERNING METHODS WHICH IMPLEMENT DIRECTED SELF-ASSEMBLY

TECHNICAL FIELD

This disclosure generally relates to semiconductor fabrication techniques and, more specifically, to self-aligned patterning methods for use in fabricating semiconductor integrated circuits.

BACKGROUND

Various types of multi-patterning photolithography techniques can be utilized to manufacture semiconductor integrated circuits. Such multi-patterning techniques include sidewall image transfer (SIT), self-aligned doubled patterning (SADP), and self-aligned quadruple patterning (SAQP) techniques, for example. The current SIT, SADP and SAQP methods utilize deposition and etch back processes to create uniform memorization and transfer elements. In particular, these techniques involve spacer patterning steps in which spacers are formed on the sidewalls of sacrificial features (e.g., sacrificial mandrels), wherein the sacrificial features are removed to leave a pattern of spacers which is used to etch features into an underlying layer at sub-lithographic dimensions.

For next generation technology nodes, e.g., 10 nm and beyond, these multi-patterning methods will become costlier and more complex because of the need to fabricate and utilize multiple levels of masks (e.g., mandrel mask, block masks, cut masks, etc.) to perform such methods. The use of multiple masks adds considerable design complexity and unwanted process variations due to limitations in mask fabrication technologies. In this regard, the semiconductor industry is considering extreme ultraviolet (EUV) lithography and other next-generation lithography technologies to replace such multi-patterning methods. However, lithographic patterning methods such as EUV are unable to perform self-aligned cutting of features since lithographic patterning methods do not implement mandrel/non-mandrel features and other components as used in SADP, for example, to enable self-aligned cutting of features.

SUMMARY

Embodiments of the invention include lithographic patterning methods which implement directed self-assembly (DSA) of block copolymers to enable self-aligned cutting of features.

For example, one embodiment includes a method which comprises forming a first layer of material on a substrate, forming a second layer of material on the first layer of material, and lithographically patterning the second layer of material to form a guiding pattern. A directed self-assembly (DSA) process is performed to form a block copolymer pattern around the guiding pattern, wherein the block copolymer pattern comprises a repeating block chain which comprises at least a first block material and a second block material, wherein the first block material and the second block material have etch selectivity with respect to each other. A selective etch process is performed to selectively etching one of the first block material and the second block material to form self-aligned openings in the block copolymer pattern which expose portions of the first layer of material. The first layer of material is patterned by etching the exposed portions of the first layer of material.

Other embodiments will be described in the following detailed description of embodiments, which is to be read in conjunction with the accompanying figures.

BRIEF DESCRIPTION OF THE DRAWINGS

FIGS. 1 through 10B schematically illustrate a lithographic patterning method which implements DSA of block copolymers to enable self-aligned cutting of features, according to an embodiment of the invention, wherein:

FIG. 1 is a schematic cross-sectional side view of a semiconductor device at an intermediate stage of fabrication, which comprises a substrate and one or more sacrificial layers formed on the substrate;

FIG. 2 is schematic cross-sectional side view of the semiconductor structure of FIG. 1 after forming a mask material layer on an upper surface of the semiconductor structure;

FIG. 3 is schematic cross-sectional side view of the semiconductor structure of FIG. 2 after patterning the mask material layer to form an etch mask that is used to pattern the sacrificial layers to form a guiding pattern;

FIG. 4 is schematic cross-sectional side view of the semiconductor structure of FIG. 3 after patterning the sacrificial layers using the etch mask to form a guiding pattern comprising a plurality of guide structures;

FIG. 5 is schematic cross-sectional side view of the semiconductor structure of FIG. 4 after depositing a layer of block copolymer material to cover the guide structures of the guiding pattern;

FIG. 6 is schematic cross-sectional side view of the semiconductor structure of FIG. 5 after thermally annealing the block copolymer layer to segregate and self-assemble first, second and third block materials of the block copolymer layer into a block copolymer pattern around the guiding pattern;

FIGS. 10A and 10B schematically illustrate the semiconductor structure shown in FIGS. 9A and 9B, respectively, after removing the guiding pattern and remaining portions of the block copolymer pattern to expose the underlying patterned hardmask, and etching portions of an insulating layer which are exposed through the patterned hardmask.

FIGS. 11 through 15 schematically illustrate a lithographic patterning method which implements DSA of block copolymers to enable self-aligned cutting of features, according to another embodiment of the invention, wherein:

FIG. 11 is a cross-sectional schematic view of a semiconductor device at an intermediate stage of fabrication in which a guiding pattern is formed on a hardmask layer;

FIG. 12 is schematic cross-sectional side view of the semiconductor structure of FIG. 11 after depositing a layer of block copolymer material to cover the guide structures of the guiding pattern;

FIG. 13 is schematic cross-sectional side view of the semiconductor structure of FIG. 12 after thermally annealing the block copolymer layer to segregate and self-assemble block components of the block copolymer layer into a block copolymer pattern between each adjacent pair of guide structures of the guiding pattern;

FIG. 14 is schematic cross-sectional side view of the semiconductor structure of FIG. 13 after etching a second block material selective to the first block material of the block copolymer pattern to form self-aligned openings that expose portions of the underlying hardmask layer; and FIG. 15 is schematic cross-sectional side view of the semiconductor structure of FIG. 13 after etching away a first block material selective to a second block material of the block copolymer pattern to form self-aligned openings that expose portions of the underlying hardmask layer.

DETAILED DESCRIPTION

Figure 3:
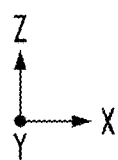
Figure 3:
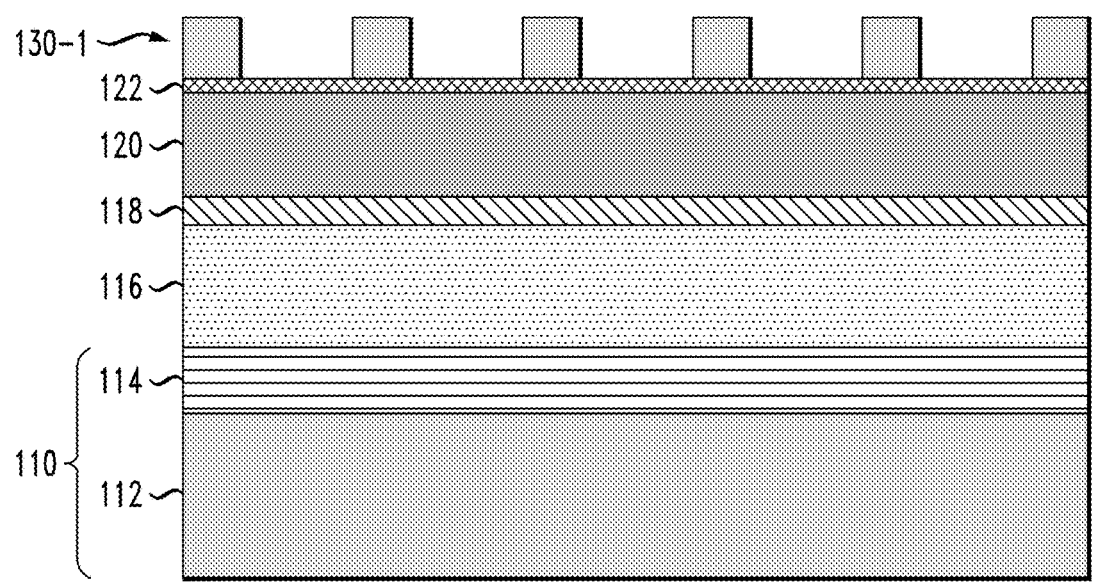

Embodiments of the invention will now be described in further detail with regard to semiconductor patterning methods in which DSA of block copolymers is utilized to enable self-aligned patterning of features. For illustrative purposes, patterning methods according to embodiments of the invention will be discussed in the context of back-end-of-line (BEOL) process modules for patterning nano-features (e.g., via holes and metal line trenches in dielectric layers), with pitches of, e.g., 40 nm and below. As noted above, self-aligned cut techniques are useful in situations where a base SADP process is utilized. However, for single exposure patterning processes such as EUV, imprint, DSA, e-beam write, etc., there is no formation of mandrel/non-mandrel features or other elements as in SADP methods, which are needed to enable self-aligned cuts. In this regard, as explained in further detail below, patterning methods according to embodiments of the invention utilize a lithographic method, such as EUV, to form a guiding pattern, followed by a DSA process to form self-assembled patterns of multi-block copolymer features, with uniform dimensions and shapes, in spaces between features of the guiding pattern. The self-assembled block copolymer materials are selected to have etch selectivity with respect to each other such that portions of the self-assembled patterns of block copolymer features can be selectively etched to form self-aligned openings for patterning of underlying layers. Advantageously, the use of DSA in conjunction with lithographic methods allows for self-aligned patterning of nano-scale features, while relaxing an overlay budget for block masks or cut masks.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor structures shown throughout the drawings, XYZ Cartesian coordinates are shown in each of the drawings. It is to be understood that the terms "vertical" or "vertical direction" as used herein denote a Z-direction of the Cartesian coordinates shown in the drawings, and that the terms "horizontal" or "horizontal direction" as used herein denote an X-direction and/or Y-direction of the Cartesian coordinates shown in the drawings, which is perpendicular to the Z-direction.

FIGS. 1 through 10B schematically illustrate a lithographic patterning method which implements DSA of block copolymers to enable self-aligned cutting of features, according to an embodiment of the invention. In particular, FIG. 1 is a cross-sectional schematic view of a semiconductor device 100 at an intermediate stage of fabrication, which comprises a substrate 110, and a stack of layers formed on top of the substrate 110. The stack of layers comprises an insulating layer 116, a hard mask layer 118, a sacrificial material layer 120, and a polymer brush layer 122. In another embodiment, an anti-reflection coating (ARC) layer, such as amorphous silicon, may be formed on the sacrificial material layer 120, wherein the polymer brush layer 122 is formed on the ARC layer. The sacrificial material layer 120, the polymer brush layer 122, and optional ARC layer comprises sacrificial material layers that are utilized to form a guiding pattern, as explained in further detail below.

The substrate 110 is generically depicted in FIG. 1 as comprising an underlying base semiconductor substrate 112 (e.g., semiconductor wafer) and a device/layer stack 114 comprising integrated circuitry and interconnect layers/structures that are formed on the base semiconductor substrate 112 prior to formation of the insulating layer 116. In one embodiment, the base semiconductor substrate 112 may be a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the base semiconductor substrate 112 may be a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL (front-end-of-line) layer.

The device/layer stack 114 comprises a FEOL layer, a MOL layer (or at least a portion of the MOL layer), and/or a BEOL layer (or at least a portion of the BEOL layer). As is known in the art, a FEOL layer comprises various semiconductor devices and components that are formed in or on the active surface of the semiconductor substrate 112 to provide integrated circuitry for a target application. For example, the FEOL layer comprises field-effect transistor (FET) devices (such as FinFET devices, planar MOSFET devices, etc.), bipolar transistors, diodes, capacitors, inductors, resistors, isolation devices, etc., which are formed in or on the active surface of the semiconductor substrate 112. In general, FEOL processes typically include preparing the semiconductor substrate 112 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

Furthermore, a MOL layer is formed on the FEOL layer. In general, the MOL layer comprises one or more PMD (pre-metal dielectric) layers and conductive contacts (e.g., via contacts) that are formed in the PMD layer. The PMD layer is formed over the components and devices of the FEOL layer. A pattern of openings is formed in the PMD layer, and the openings are filled with a conductive material, such as tungsten, to form conductive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure.

A BEOL structure is formed on the FEOL/MOL structure to connect the various integrated circuit components of the FEOL layer. As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the exemplary embodiment of FIG. 1, the insulating layer 116 generically represents an interlevel dielectric layer (ILD layer) that forms a given interconnect level of a BEOL layer, and which is to be patterned using a self-aligned patterning method as discussed below. For example, for a BEOL layer, the insulating layer 116 can be etched using methods discussed hereon to form a pattern of openings (e.g., trenches or vias) in the insulating layer 116, which are to be filled with metallic materials such as copper to form wiring and vertical via structures, etc. The insulating layer 116 can be formed using any suitable dielectric material including, but not limited to, silicon oxide (e.g. SiO2), SiN (e.g., (Si3N4), hydrogenated silicon carbon oxide (SiCOH), silicon based low-k dielectrics, porous dielectrics, or other known ULK (ultra-low-k) dielectric materials. The insulating layer 116 can be deposited using known deposition techniques, such as, for example, ALD (atomic layer deposition), CVD (chemical vapor deposition) PECVD (plasma-enhanced CVD), or PVD (physical vapor deposition). The thickness of the insulating layer 116 will vary depending on the application, and may have a thickness in a range of about 30 nm to about 200 nm, for example.

The hard mask layer 118 is formed on the insulating layer 118 using known deposition techniques. The hard mask layer 118 is formed of a material that has etch selectivity with respect to the insulating materials of the insulating layer 116 and the second insulating layer 120. For example, the hard mask layer 118 can be formed of a nitride material such as TiN or SiN, etc. Depending on the given BEOL process module utilized, the hard mask layer 118 may comprise a multi-layer hard mask structure comprising, for example, a silicon nitride (SiN) layer and a titanium oxide (TiOx) or titanium nitride (TiN) layer.

The sacrificial material layer 120 is formed of any suitable material, such as amorphous silicon (a-Si), a self-planarizing organic material (organic planarizing layer (OPL)), etc., which can be etched to form a guiding pattern. The polymer brush layer 122 comprises a polymer material that is grafted on the surface of the sacrificial material layer 120 (or on the surface of an ARC layer formed on the sacrificial material layer 120) using known techniques. As will be explained in further detail below, the polymer brush layer 122 serves as a "wetting layer" to enable orientation of the block copolymers in a subsequent DSA process by providing a surface on a guiding pattern which has an affinity to at least one block copolymer material of a multi-block copolymer that is used for the DSA process.

Figure 4:
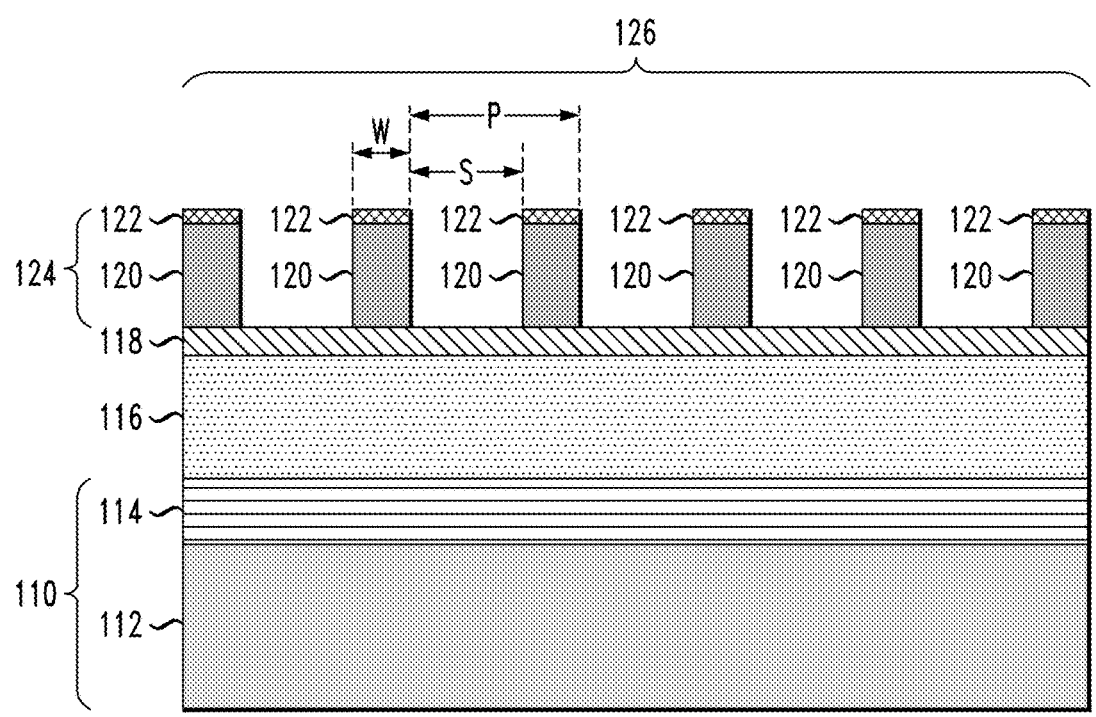

A next phase of the process flow, as schematically illustrated in FIGS. 2, 3, and 4, comprises forming a guiding pattern that is structurally configured and dimensioned to allow the self-assembly of block copolymer structures for a self-aligned patterning process. In particular, FIG. 2 is schematic cross-sectional side view of the semiconductor structure of FIG. 1 after forming a mask material layer 130 on an upper surface of the semiconductor structure FIG. 2, and FIG. 3 is schematic cross-sectional side view of the semiconductor structure of FIG. 2 after patterning the mask material layer 130 to form an etch mask 130-1 that is used to pattern the polymer brush layer 122 and the sacrificial material layer 120 to form a guiding pattern. The etch mask 130-1 can be fabricated using any suitable lithographic process including, but not limited to, EUV lithography, x-ray lithography, electron beam lithography, ion-beam lithography, imprint lithography, etc. The type of materials that are used for the mask material layer 130 will vary depending on the type of lithographic process that is implemented in the process flow.

Next, FIG. 4 is schematic cross-sectional side view of the semiconductor structure of FIG. 3 after patterning the sacrificial layers (e.g., 120 and 122) using the etch mask 130-1 to form a guiding pattern 126 comprising a plurality of guide structures 124 (e.g., mandrel features) that define the guiding pattern 126. As shown in FIG. 4, each guide structure 124 comprises a portion of the polymer brush layer 122 and a portion of the sacrificial material layer 120. In one embodiment, the patterning process can be performed using a dry plasma etch process such as, but not limited to, a reactive ion etching (RIE) process with an etch chemistry that is suitable to anisotropically etch exposed portions of the polymer brush layer 122 and the sacrificial material layer 120 down to the hard mask layer 118. The etch process may be performed using two separate RIE processes with different etch chemistries that are configured to selectively etch the materials that form the polymer brush layer 122 and the sacrificial material layer 120 (and optional Si-ARC layer interposed therebetween). The RIE process is performed selective to the underlying hard mask layer 118 so that the hard mask layer 118 serves as an etch stop for the patterning process. The etch process also results in the removal of the etch mask 130-1.

As shown in FIG. 4, each guide structure 124 has a width W and is spaced apart from an adjacent guide structure 124 by a spacing S, and the guide structures 124 of the guiding pattern 126 have a pitch P. In one embodiment, the width W of each guide structure 124 is in a range of about 20 nm to about 40 nm, the spacing S between adjacent guide structures 124 is in a range of about 20 nm to about 40 nm, and the pitch P is in a range of about 40 nm to about 80 nm.

Figure 5:
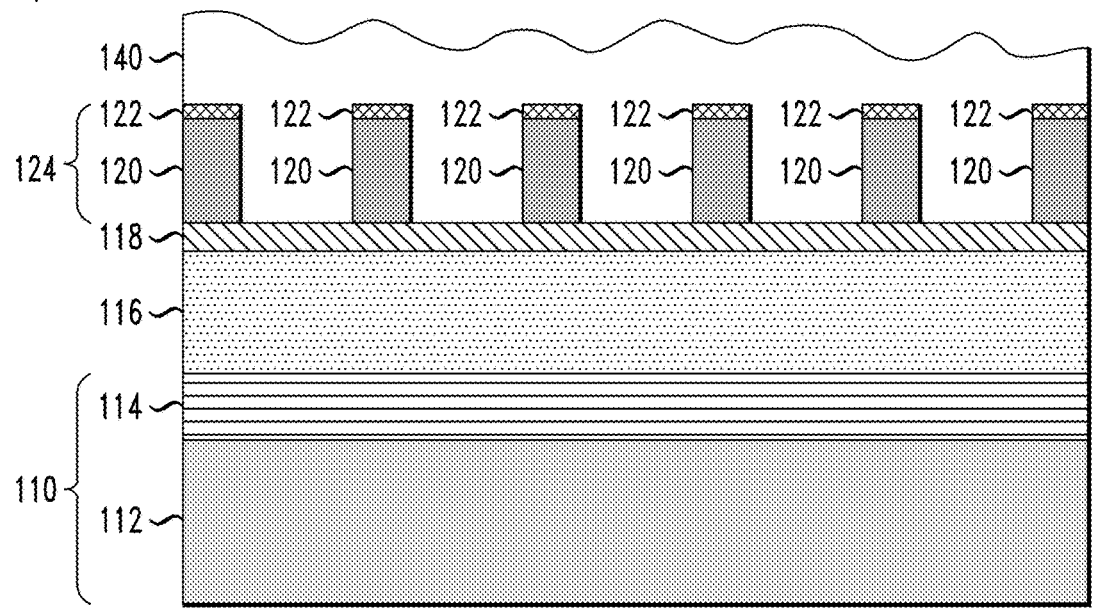
Figure 6:
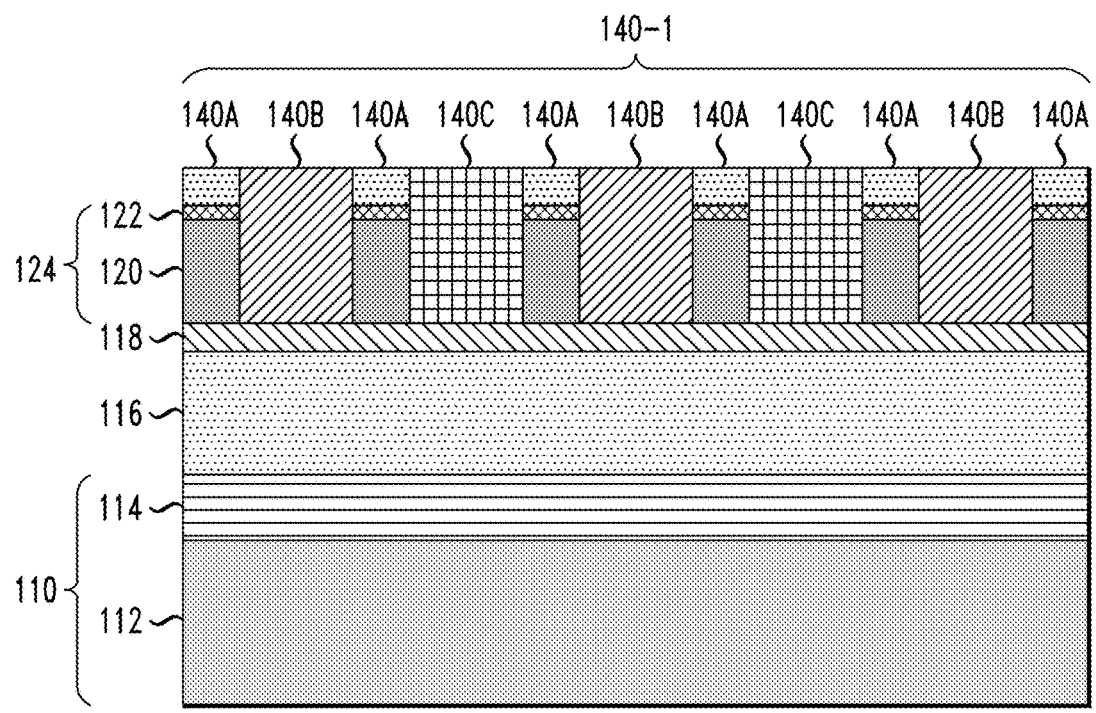

After forming the guiding pattern 126, a next phase of the process flow comprises performing a DSA process to form self-assembled patterns of multi-block copolymer features, with uniform dimensions and shapes, around the guide structures 124 of the guiding pattern 126, as schematically illustrated in FIGS. 5 and 6. As is known in the art, block copolymers are a class of polymers having two or more polymer chains (or blocks) that are chemically bound to each other. In the exemplary process flow shown in FIGS. 5 and 6, a DSA process is performed to fill every other space between the guide structures 124 with one of two different block copolymer materials which have an etch selectivity with respect to each other.

In particular, as an initial step of the DSA process, FIG. 5 is schematic cross-sectional side view of the semiconductor structure of FIG. 4 after depositing a layer of block copolymer material 140 to cover the guide structures 124 of the guiding pattern 126. In one embodiment, the layer of block copolymer material 140 (or block copolymer layer 140) comprises an engineered mixture of different block materials (e.g., polymerized monomers) which, when subjected to a thermal anneal process, will phase-separate at the molecular level, and then self-organize and assemble into three-tone block pattern comprising alternating "B-A-C" and "C-A-B" block chains. For example, FIG. 6 is schematic cross-sectional side view of the semiconductor structure of FIG. 5 after thermally annealing the block copolymer layer 140 to segregate and self-assemble the constituent block components of the block copolymer layer into separate first, second and third block materials 140A, 140B and 140C (or components) which form a block copolymer pattern 140-1 of nanostructures around the guiding pattern 126.

In the example embodiment shown in FIG. 6, the first, second, and third block materials 140A, 140B and 140C of the block copolymer layer 140 are configured to micro-phase-separate and self-assemble into a "three-tone" block copolymer pattern 140-1 comprising an alternating block pattern 140B-140A-140C and 140C-140A-140B. The polymer brush layer 122 is formed of a polymer material that provides a favorable surface (e.g., wetting surface) for the first block material 140A of the block copolymer layer 140 such that the first block material 140A self-assembles on top of the guide structures 124. Further, since the block copolymer layer 140 is configured to form a 140B-140A-140C or 140C-140A-140B block pattern, the first block material 140A will constrain the second and third block materials 140B and 140C of the block copolymer layer 140 to self-assemble on opposing sides of the first block material 140A and, consequently, fill the spaces on opposing sides of each guide structure 124. In this regard, the guiding pattern 126 is configured to automatically direct the orientation and formation of the first block material 140A on top of the guide structures 124 and fill every other space between the guide structures 124 with either the second block material 140B or the third block material 140C, resulting in the intermediate structure schematically shown in FIG. 6. Various mechanisms can be utilized to "anchor" one of more of the phases 140B and 140C to ensure that a given one of the phase 140B or 140C is assembled in target spaces, and to ensure that the block pattern 140-1 is formed with alternating phases of 140B-140A-140C-140A-140B-140A-140C-140A-140B . . . , etc., without jitter.

In an embodiment, the first block material 140A comprises polystyrene, and the second and third block materials 140B and 140C comprise materials that can be etched selective to each other and which can form a 140B-140A-140C block chain when the first block material 140A is formed of polystyrene. For example, in one embodiment, the second block material 140B comprises trimethylsilane (TMS) or trimethylsilyl hydride, which has a compound formula of $C_3H_{10}Si$ (or structural formula $(CH_3)_3SiH$). Further, the third block material 140C comprises Poly (methyl methacrylate) (PMMA). In one embodiment, the second and third block materials 140B and 140C are selected to have an etch selectivity of at least 5:1 or greater.

The block copolymer layer 140 can be deposited (in FIG. 5) using any suitable deposition process such as spin-on coating, dip-coating, drop-coating, etc. A thermal annealing process is then performed at a temperature in a range of about 150° C. to about 200° C. and for a period of time, which is sufficient for the constituent block components of the block copolymer layer 140 to phase-separate and assemble into periodic blocks (i.e., into separate domains). As is understood by those of ordinary skill in the art, the specific characteristics and equilibrium morphologies of the resulting block copolymer pattern 140-1 that is formed, is based on various factors including, but not limited to, the molecular characteristics of the constituent block components of the block copolymer layer 140, the thickness of the block copolymer layer 140, the relative proportion of the different block materials in the engineered multi-block copolymer mixture, the surface energies and molecular interaction between the different copolymer block materials and the materials that form the substrate surface and guide structures, etc.

Furthermore, it is understood that the constituent copolymer blocks can only phase-separate to a distance which is commensurate with the chain sizes of the copolymer blocks. In this regard, the commensurability between the sizes of the guiding structures 124 and the spacing between the guiding structures 124 of the guiding pattern 126 and the natural pitch of the copolymer block chains is an important fact that is taken into considerations so that the guiding pattern 126 can facilitate otherwise induce a high degree of positional and orientational order in the self-assembled, nanoscale block patterns.

In the example embodiments discussed herein, to facilitate the phase separation and self-assembly of the different blocks which occurs during the thermal anneal process, the guiding pattern 126 is fabricated with low aspect ratio features, and the constituent components of the block copolymer layer 140 are selected to be short length polymers. The first block material 140A within block copolymer layer 140 is designed to have a block length that is at least substantially the same as the width W of the guide structures 124, and the second and third block materials 140B and 140C are designed to have block lengths that are at least substantially the same as the spacing S between the guide structures 124. The dimensions of the guiding pattern 126 places physical constraints on the block formation such that the resolution of the self-assembled, nanoscale patterns is not too important and there can be some minimal degree of non-commensurability between the guiding feature spacing and the natural pitch and domain sizes of the copolymer blocks, as the guiding pattern 126 would induces some degree of positional and orientational order on the pitch and domain sizes of the copolymer blocks that organize and self-assemble during the thermal anneal process.

Figure 7A:
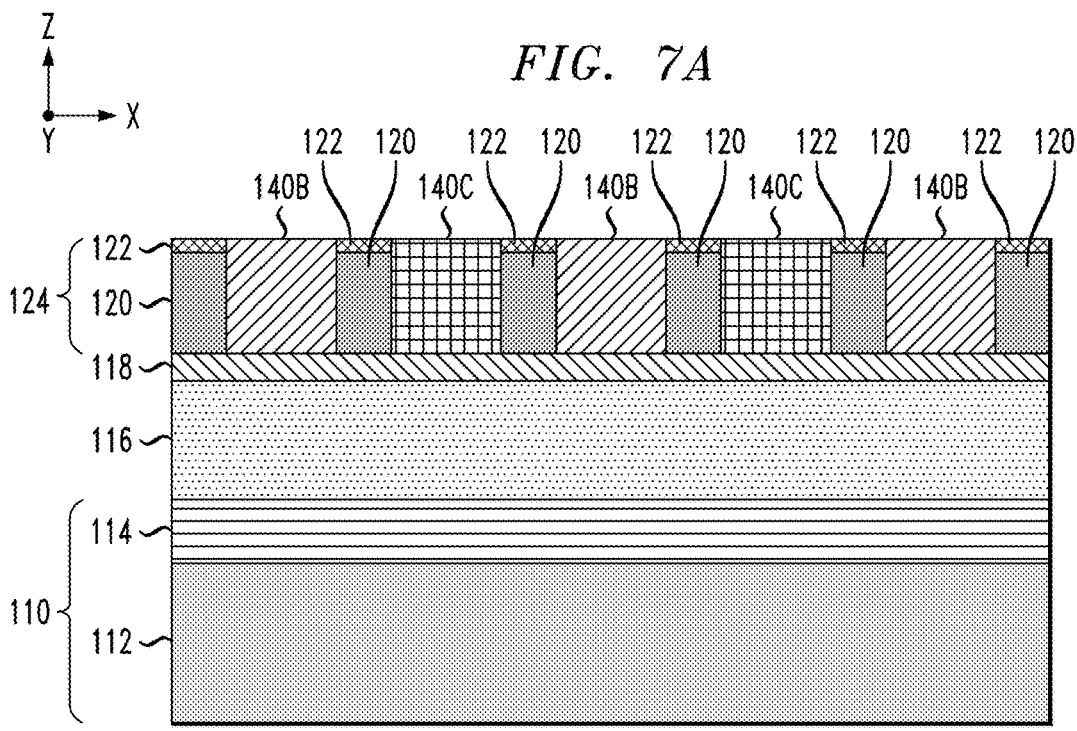
FIGS. 7A and 7B schematically illustrate the semiconductor structure of FIG. 6 after recessing the block copolymer pattern down to the guide structures of the guiding pattern, and forming a cut mask.
Figure 7B:
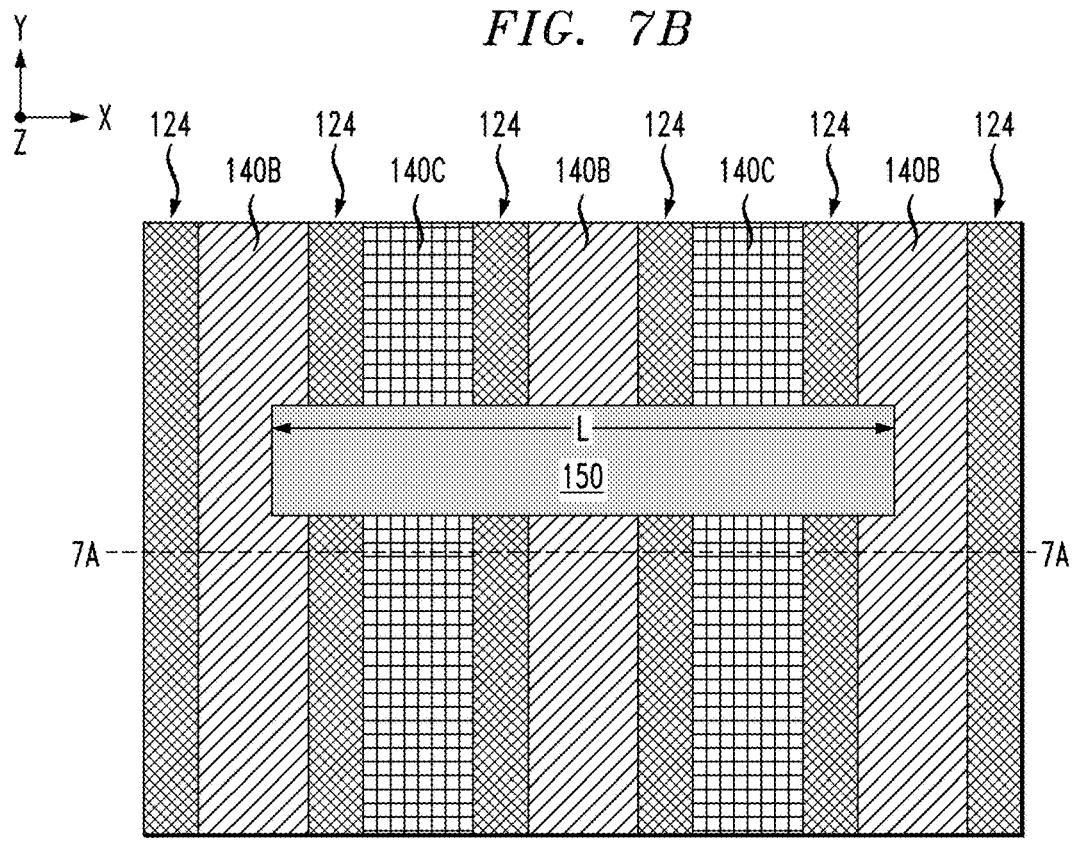

A next phase of the process flow, as schematically illustrated in FIGS. 7A, 7B, 8A, and 8B, is to etch the block copolymer pattern 140-1 to form a pattern of self-aligned openings in the block copolymer pattern 140-1, which are utilized to etch the underlying layers (e.g., the hardmask layer 118). In particular, as an initial step, FIGS. 7A and 7B schematically illustrate the semiconductor structure of FIG. 6 after recessing the block copolymer pattern 140-1 down to the guide structures 124 of the guiding pattern 126. FIG. 7A is a schematic cross-sectional view (X-Z plane) of the semiconductor structure shown in FIG. 6, while FIG. 7B is a schematic top plan view of the semiconductor structure of FIG. 7A along an X-Y plane. In addition, FIG. 7A is a cross-sectional view of the semiconductor structure of FIG. 7B taken along line 7A-7A in FIG. 7B.

As shown in FIGS. 7A and 7B, in some embodiments, the recess process results in the removal of the first block material 140A on the upper surfaces of the guide structures 124, and recesses the upper surface of the second and third block materials 140B and 140C down to a level of the upper surfaces of the guide structures 124. The block copolymer pattern 140-1 can be recessed using, for example, an etch-back process (e.g., RIE) or a chemical-mechanical planarizing (CMP) process, or any other suitable etch process. The RIE process can be a timed etch process using a non-selective etch chemistry that is configured to etch down the first, second, and third block materials 140A, 140B and 140C using a single RIE process flow.

In the example embodiment shown in FIGS. 7A and 7B, the upper layers 122 of the guide structures 124 can be left in place in circumstances where the upper layers 122 comprise a Si-ARC layer, as the Si-ARC layer serves to enhance the etch selectivity of the guide structures 124 for subsequent etching steps. During the etch-back/planarizing process, the polymer brush layer (e.g., polystyrene graft) may be removed from the upper surface of the Si-ARC layer such that the upper layers 122 shown in FIGS. 7A and 7B only comprise the Si-ARC material. In other embodiments, the etch-back or CMP process can be performed to recess the block copolymer pattern 140-1 down to the sacrificial material layers 120 of the guides structures 124.

Figure 8A:
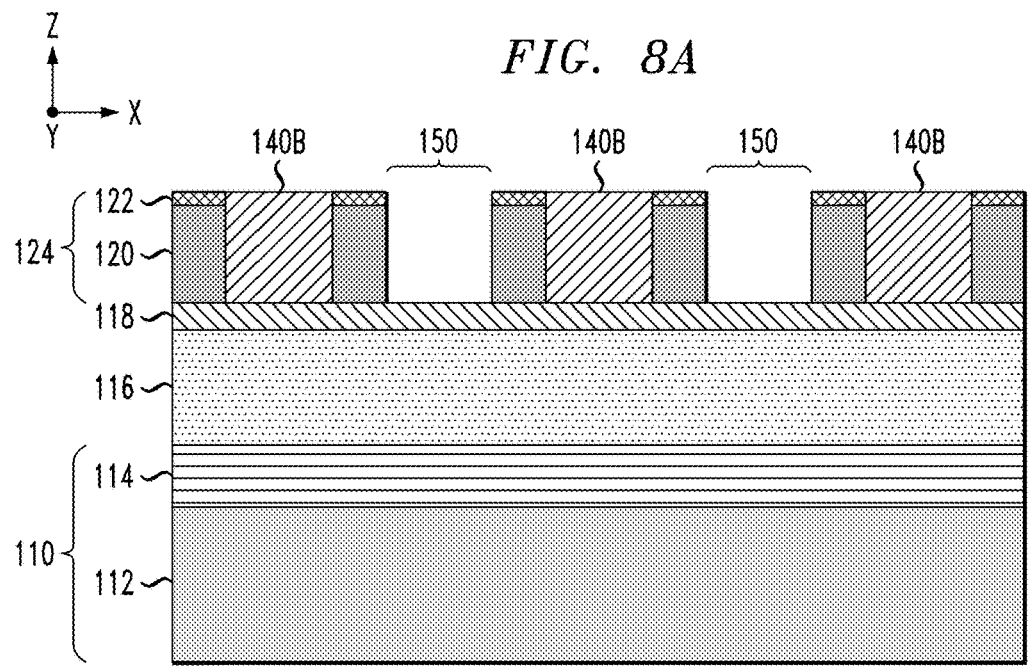
FIGS. 8A and 8B schematically illustrate the semiconductor structure shown in FIGS. 7A and 7B, respectively, after etching away the third block material selective to the second block material to form self-aligned openings that expose portions of an underlying hardmask layer.

Following the recessing of the block copolymer pattern 140-1, a selective etch process is performed to further pattern the block copolymer pattern 140-1 by etching away the second block material 140B selective to the third block material 140C, or by etching away the third block material 140C selective to the second block material 140B. For example, FIG. 8A is a schematic cross-sectional view of the semiconductor structure shown in FIG. 7A after etching away the third block material 140C selective to the second block material 140B (and selective to the guide structures 124) to form a pattern of self-aligned openings 150 (e.g., trench openings) that expose portions of the underlying hardmask layer 118. The etch process can be performed using a RIE process having an etch chemistry which is configured to selectively etch exposed portions of the third block material 140C down to the hardmask layer 118.

Prior to performing the selective etch process, as further shown in FIG. 7B, an optional cut mask 150 (or block mask) can be formed on the surface of the semiconductor structure to protect certain portions of the third block material 140C from being etched during the selective etch process. In the example embodiment of FIG. 7B, the cut mask 150 is formed with a pattern that defines "cuts" in subsequently formed features (e.g., cuts in metal lines), as is known in the art. The cut mask 150 can be a photoresist mask that is formed using a standard photolithography process. As shown in FIG. 7B, the presence of the block material 140B serves to reduce the overlay budget for fabricating the cut mask 150 at least in a length L direction of the cut mask 150. In particular, as shown in FIG. 7B, each length end of the cut mask 150 can land anywhere on relatively large area defined by the total width of two adjacent guide structures 124 with block material 140B interposed therebetween, without overlapping non-target portions of the third block material 140C.

Figure 8B:
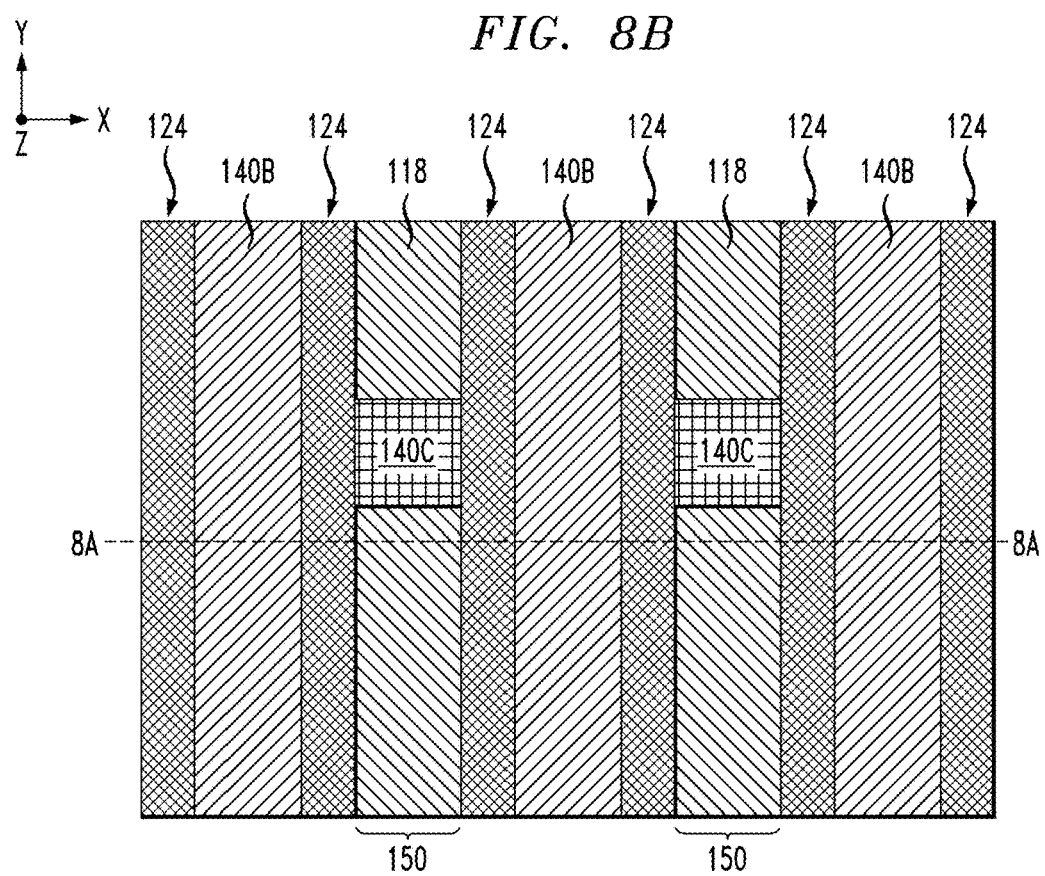

FIG. 8B is a schematic top plan view of the semiconductor structure of FIG. 8A along an X-Y plane, and FIG. 8A is a cross-sectional view of the semiconductor structure of FIG. 8B taken along line 8A-8A in FIG. 8B. FIG. 8B schematically illustrates the semiconductor structure shown in FIG. 7B after etching away the third block material 140C selective to the second block material 140B (and the guide structures 124), and removing the cut mask 150. As shown in FIG. 8B, remaining portions of the third block material 140C, which were protected by the cut mask 150, provide a discontinuity (i.e., cut) in the self-aligned openings 150 that are formed as a result of the selective etch process.

Figure 9A:
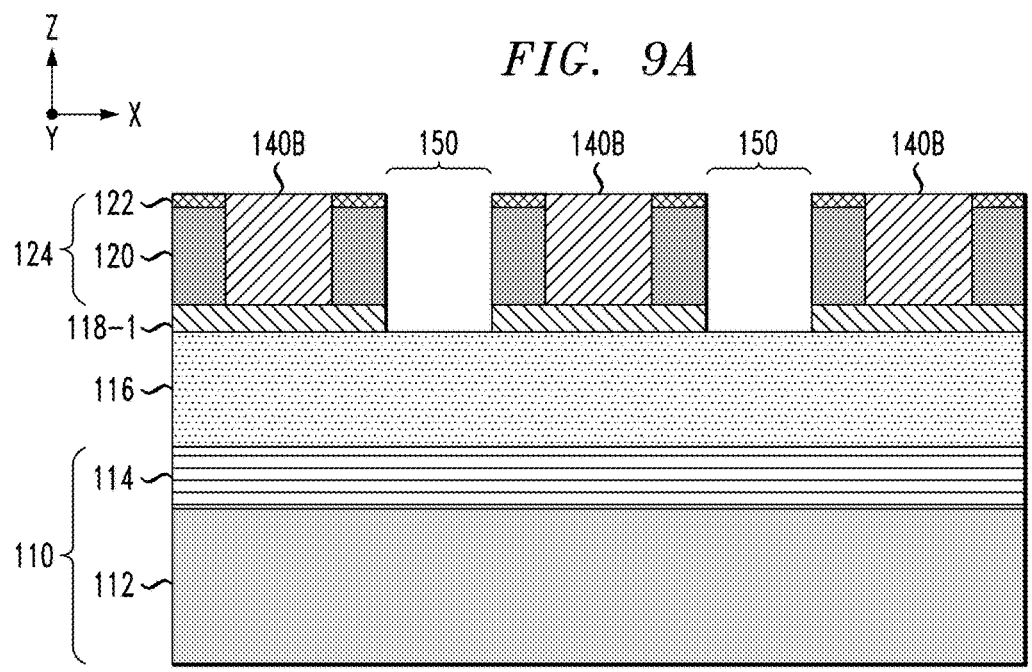
FIGS. 9A and 9B schematically illustrate the semiconductor structure shown in FIGS. 8A and 8B, respectively, after etching portions of the hardmask layer which are exposed through the self-aligned openings to form a patterned hardmask.
Figure 9B:
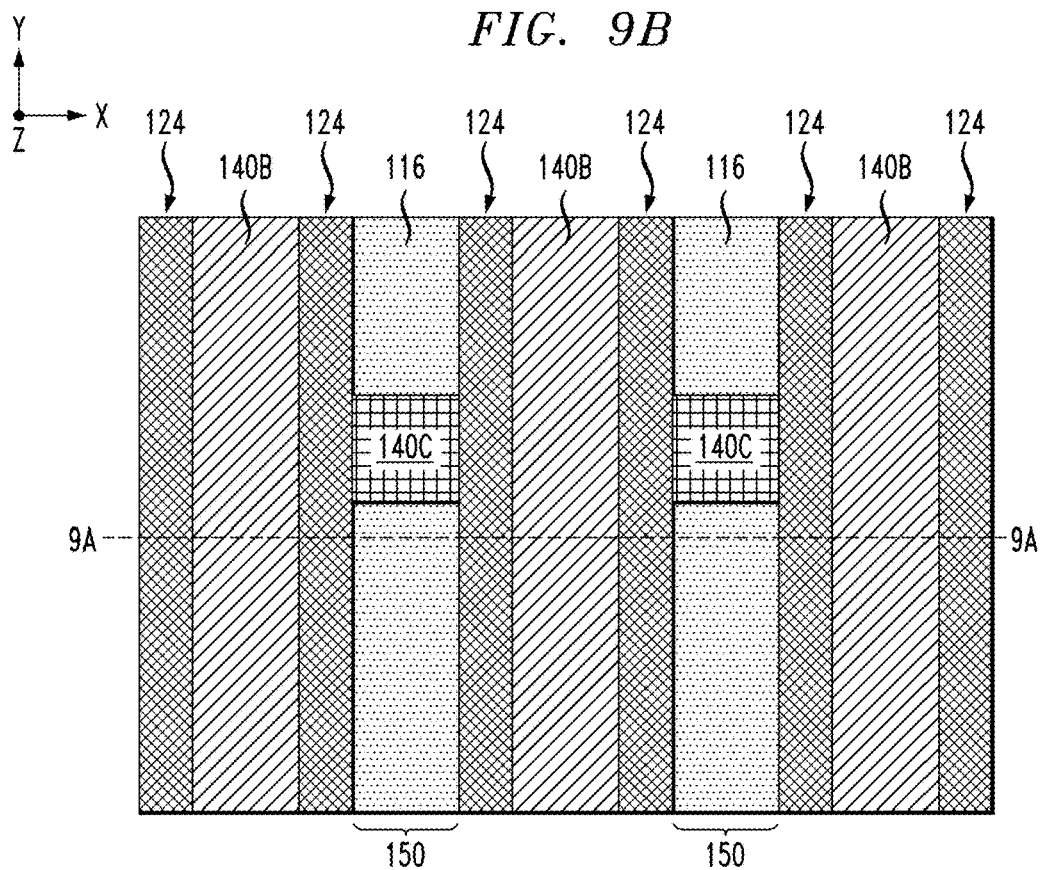

A next phase of the process flow comprises patterning the hard mask layer 118, and then transferring an image of the patterned hardmask layer 118 into the underlying insulating layer 116. For example, FIGS. 9A and 9B schematically illustrate the semiconductor structure of FIGS. 8A and 8B, respectively, after etching portions of the hardmask layer 118 which are exposed through the self-aligned openings 150 of an etch mask that is collectively defined by the guide structures 124, the second block material 140B, and the remaining portions of the third block material 140C, to form a patterned hardmask 118-1. The hardmask layer 118 can be etched using a RIE etch process having an etch chemistry that is selective to the material(s) of the hardmask layer 118.

Figure 10A:
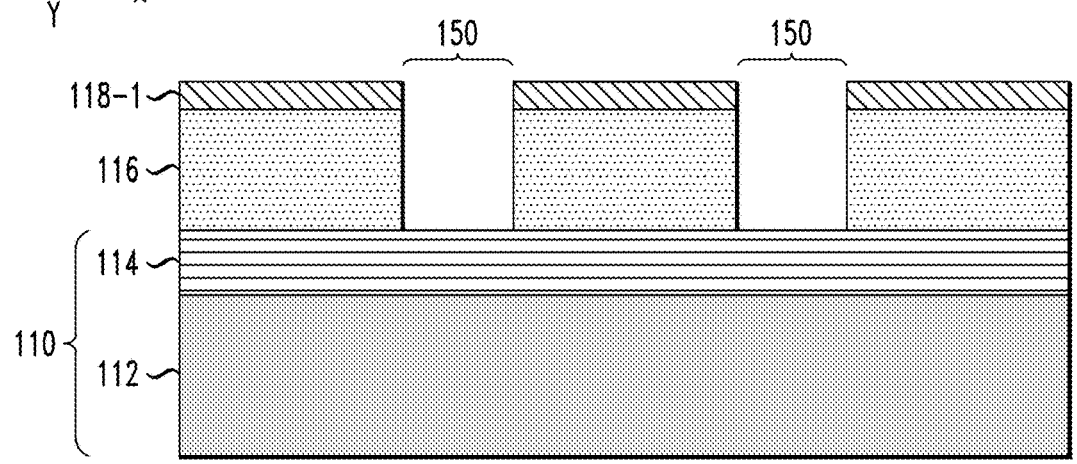
Figure 10B:
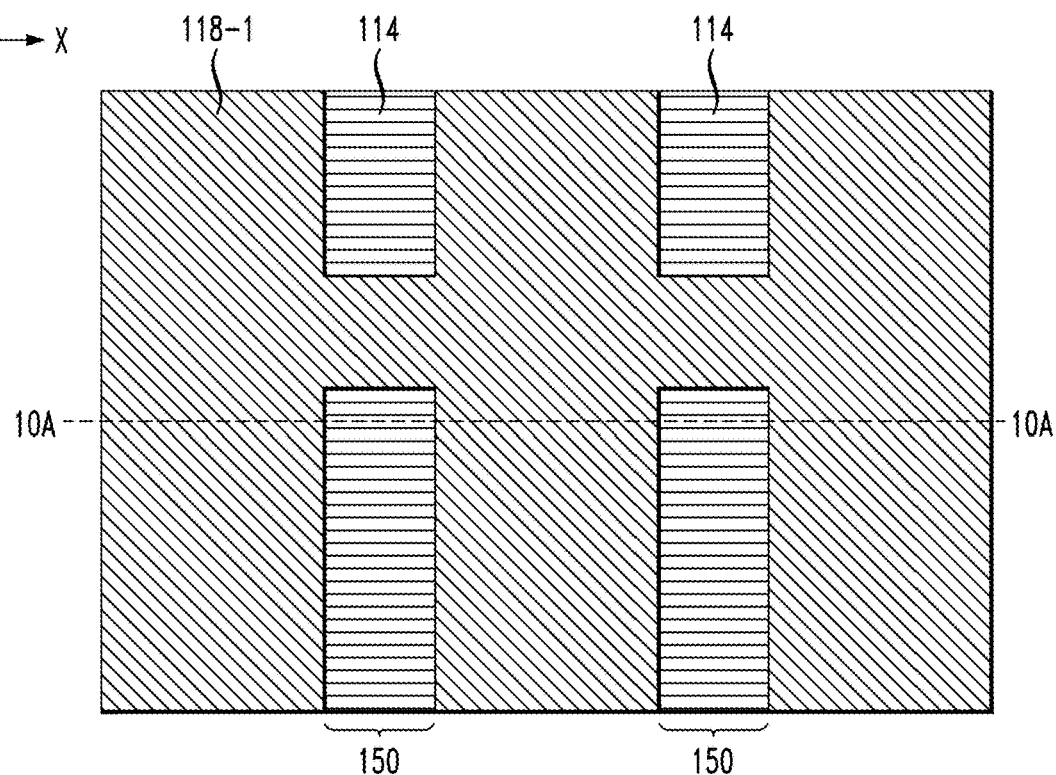

Next, FIGS. 10A and 10B schematically illustrate the semiconductor structure shown in FIGS. 9A and 9B, respectively, after removing the etch mask (e.g., guiding pattern 126 and the second and third block materials 140B and 140C) to expose the underlying patterned hardmask 118-1, and etching portions of the insulating layer 116 which are exposed through the self-aligned openings 150 that are transferred to the patterned hardmask 118-1. As shown in FIGS. 10A and 10B, the etch process of FIGS. 9A and 9B serves to transfer an image of the self-aligned openings 150 into the hardmask layer 118 to form the patterned hardmask 118-1. The patterned hardmask 118-1 is then utilized as an etch mask to etch the insulating layer 116. The insulating layer 116 can be etched using a RIE process having an etch chemistry which is configured to selectively etch exposed portions of the insulating layer 116 down to the MOL layer of the FEOL/MOL layer 114.

The etch process results in the formation of trench openings in the insulating layer 116, as well as via openings (not specifically shown) in some regions of the insulating layer 116. The trench openings (and via openings) formed in the insulating layer 116 are subsequently lined with a thin barrier diffusion layer and filled with conductive material (e.g., copper) to form metal lines and conductive vias. As shown in FIG. 10B, portions of the patterned hardmask 118-1 form "cuts" in the trench openings 150 such that the cuts are transferred to the insulating layer 116 to provide cuts in the metal lines that are formed in the trench openings.

FIGS. 11-15 schematically illustrate a lithographic patterning method which implements DSA of block copolymers to enable self-aligned cutting of features, according to another embodiment of the invention. The patterning method of FIGS. 11-16 is similar to the patterning method discussed above for FIGS. 1-10B, except that the patterning method of FIGS. 11-15 utilizes DSA to produce a "two-tone" block copolymer pattern comprising two different block copolymers that have etch selectivity with respect to each other.

Figure 11:
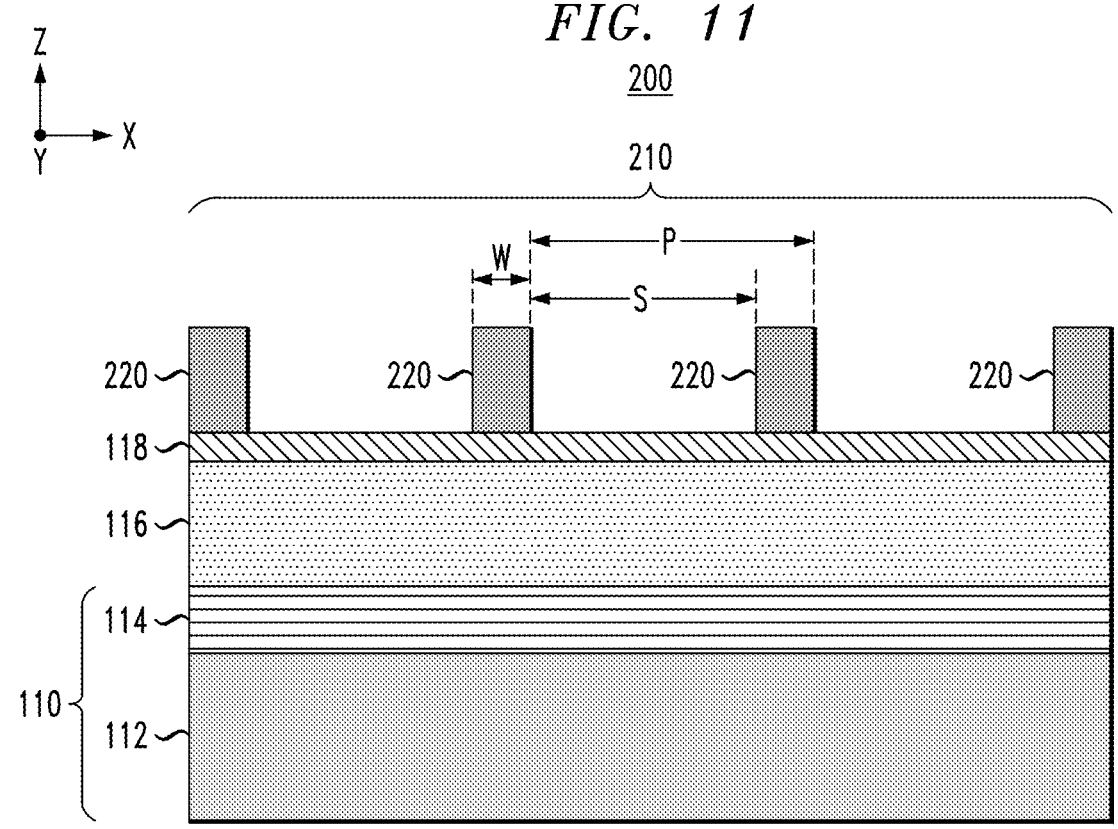

In particular, FIG. 11 is a cross-sectional schematic view of a semiconductor device 200 at an intermediate stage of fabrication in which a guiding pattern 210 is formed on a hardmask layer 118. For ease of illustration and discussion, it is assumed that the elements 110, 116 and 118 in FIG. 11 are the same elements shown in FIG. 4. The guiding pattern 210 comprises a plurality of guide structures 220 (e.g., mandrels) that are formed by lithographically patterning a sacrificial material layer. In one embodiment, the guide structures 220 are formed of amorphous silicon (a-Si) or any other material which is suitable for the given application. As shown in FIG. 11, each guide structure 220 has a width W and is spaced apart from an adjacent guide structure 220 by a spacing S, and the guide structures 220 of the guiding pattern 210 have a pitch P. In one embodiment, the width W of each guide structure 220 is in a range of about 20 nm to about 40 nm, the spacing S between adjacent guide structures 220 is in a range of about 20 nm to about 40 nm, and the pitch P is in a range of about 40 nm to about 80 nm.

Figure 12:
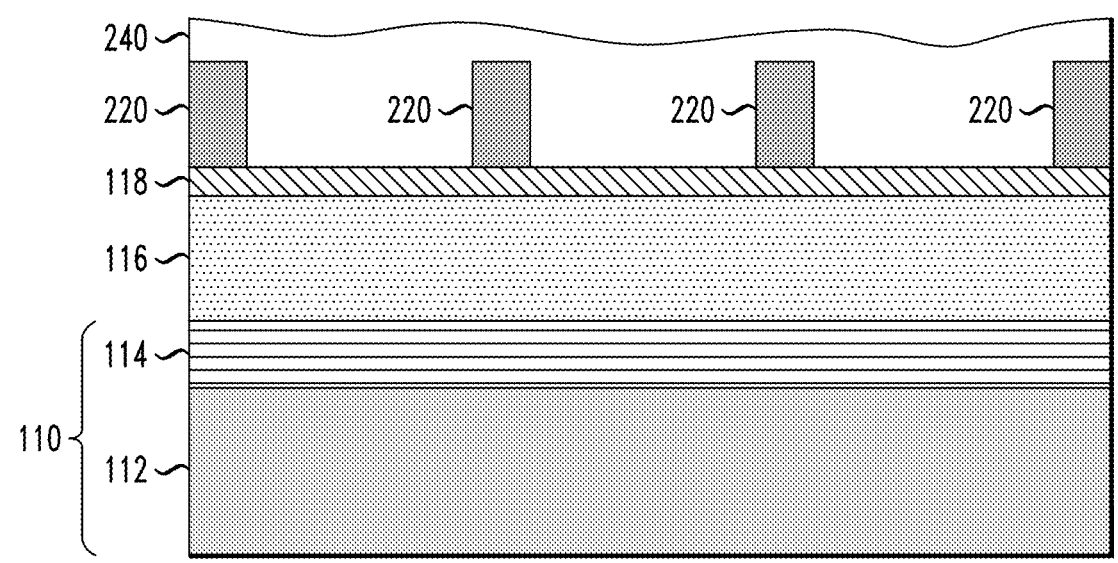

Next, FIG. 12 is schematic cross-sectional side view of the semiconductor structure of FIG. 11 after depositing a layer of block copolymer material 240 to cover the guide structures 220 of the guiding pattern 210. In one embodiment, the layer of block copolymer material 240 (or block copolymer layer 140) comprises a diblock copolymer layer which comprises two different block materials, e.g., a first bock material 240A and a second block material 240B, which have etch selectivity with respect to each other, and which are configured to self-assemble into a repeating block chain of 240A-240B.

Figure 13:
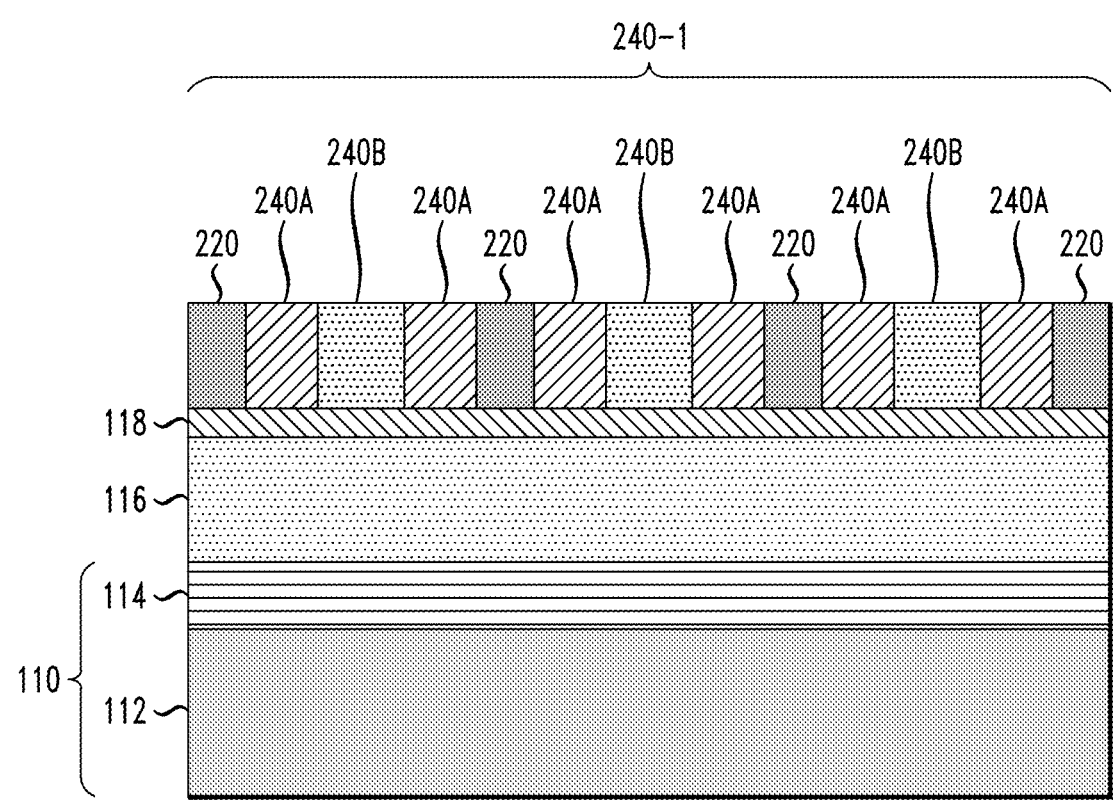

In particular, FIG. 13 is schematic cross-sectional side view of the semiconductor structure of FIG. 12 after thermally annealing the block copolymer layer 240 to segregate and self-assemble the first and second block materials 240A and 240B of the block copolymer layer 240 into a two-tone block copolymer pattern 240-1 that is formed in the spaces between adjacent guide structures 220. In particular, as shown in FIG. 13, the first and second block materials 240A and 240B of the block copolymer layer 240 are configured to microphase-separate and self-assemble into a two-tone block copolymer pattern 240-1, which comprises a block pattern 240A-240B-240A, in each space between adjacent pairs of guide structures 220. The spacing S between adjacent guide structures 220, coupled with the block lengths of the first and second block materials 240A and 240B of the engineered block copolymer layer 240, cause the self-assembly of the two-tone block patterns 240A-240B-240A between each pair of adjacent guide structures 220.

The first and second block materials 240A and 240B are selected to have an etch selectivity of about 5:1 or greater with respect to each other. For example, in one embodiment, the first block material 240A comprises TMS and the second block material 240B comprises PMMA. In another embodiment, the first block material 240A comprises propyltrimethoxysilane (PTMS) and the second block material 240B comprises PMMA.

In another embodiment, the guide structures 220 can have a wetting layer (e.g., brush layer) formed on an upper surface of the guide structures 200 as a means to constrain the self-assembly and orientation of the first and second block materials 240A and 240B. For example, the wetting layer formed on top of the guide structures 220 can be a material that has an affinity to the first block material 240A. In this instance, during the DSA process, the first block material 240A would assemble on top of, and around the sides of the guide structures 220, with the second block material 240B assembling on opposite sides of the first block material 240A, with the natural copolymer block chains forcing a two-tone block copolymer pattern 240-1 (comprising a repeating chain of 240B-240A-240B-240A, etc. In this instance, the intermediate structure shown in FIG. 13 would be obtained by planarizing the surface of the semiconductor structure down to the upper surfaces of the guide structures 220 to remove the portions of the block copolymer pattern 240-1 that are disposed above the guide structures 220.

Figure 14:
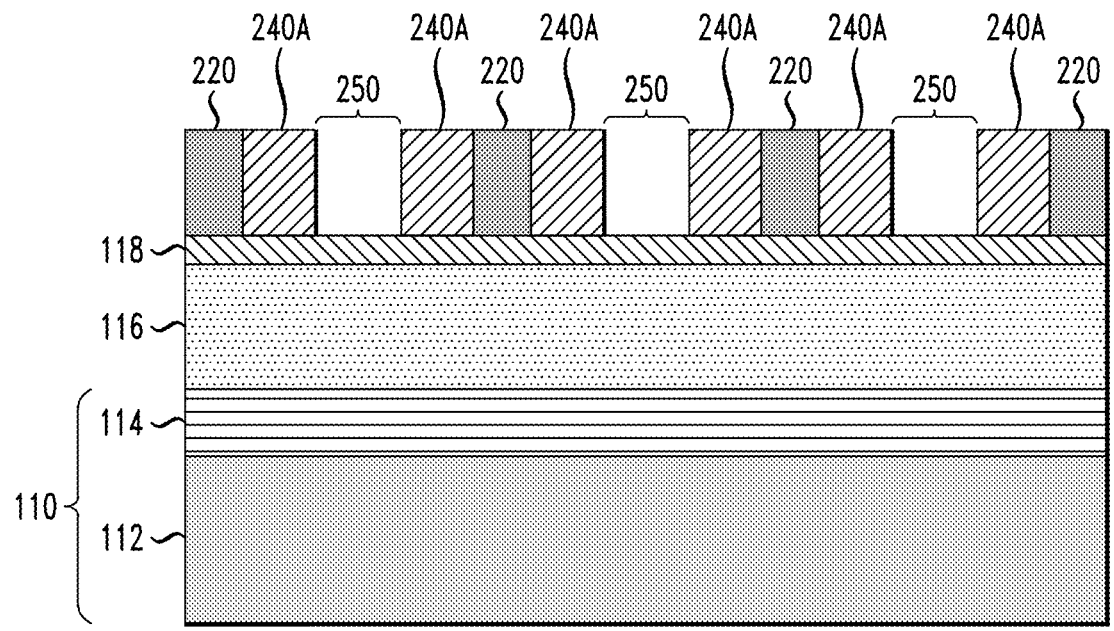

Following formation of the two-tone block copolymer pattern 240-1 shown in FIG. 13, depending on the desired cut pattern, the first block material 240A can be etched selective to the second block material 240B, or the second block material 240B can be etch selective to the first block material 240A. For example, FIG. 14 is schematic cross-sectional side view of the semiconductor structure of FIG. 13 after etching away the second block material 240B selective to the first block material 240A and the guide structures 220 to form self-aligned openings 250 (e.g., trench openings) that expose portions of the underlying hardmask layer 118. The etch process can be performed using a RIE process having an etch chemistry which is configured to selectively etch exposed portions of the second block material 240B down to the hardmask layer 118. In another embodiment, a cut mask or block mask can be formed prior to the etch process to prevent target regions of the second block material 240B from being etched, using techniques as discussed above with regard to FIGS. 7B and 8B, for example.

Figure 15:
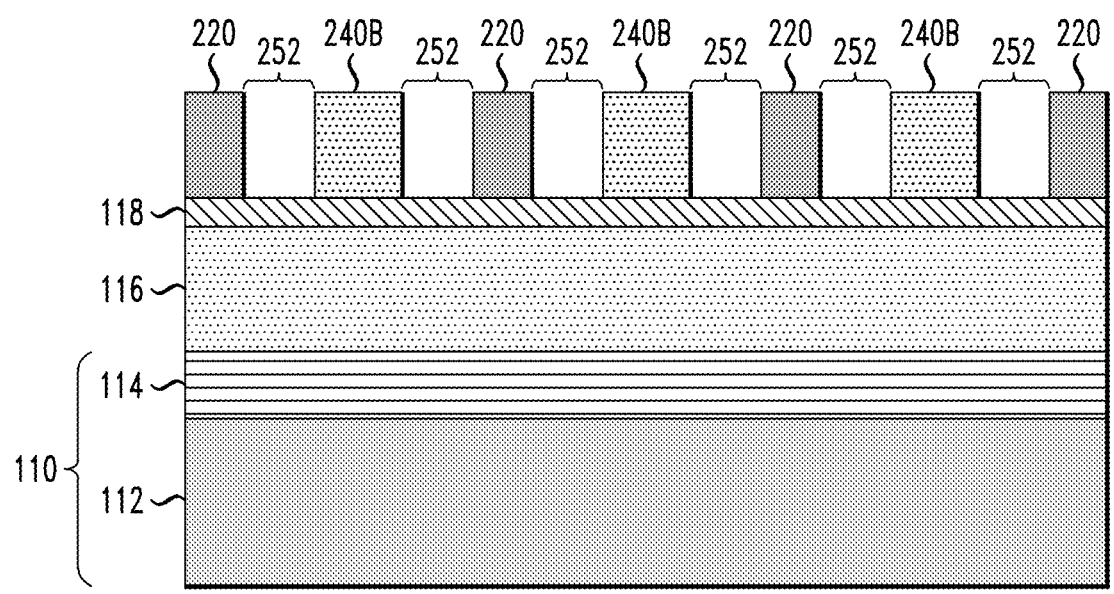

In an alternate embodiment, FIG. 15 is schematic cross-sectional side view of the semiconductor structure of FIG. 13 after etching away the first block material 240A selective to the second block material 240B and the guide structures 220 to form self-aligned openings 252 (e.g., trench openings) that expose portions of the underlying hardmask layer 118. The etch process can be performed using a RIE process having an etch chemistry which is configured to selectively etch exposed portions of the first block material 240A down to the hardmask layer 118. Furthermore, a cut mask or block mask can be formed prior to the etch process to prevent target regions of the first block material 240A from being etched, using techniques as discussed above with regard to FIGS. 7B and 8B, for example.

Following the etching of the block copolymer pattern 240-1 resulting in the intermediate semiconductor structure shown in FIG. 14 or FIG. 15, the hardmask layer 118 and the underlying insulating layer 116 are etched using the same or similar methods as discussed above (for FIGS. 9A, 9B, 10A, and 10B) to transfer the image of the self-aligned openings 250 or 252 into the hardmask layer 118 and the insulating layer 116.

As noted above, for BEOL applications, the trench openings formed in the patterned insulating layer 116 comprises openings that can be filled with metallic material (e.g., copper) to form wiring and interconnects for the given interconnect level of a BEOL interconnect structure. In another embodiment, assuming that the layer 116 comprises an active layer of semiconductor material (e.g., epitaxial silicon, epitaxial silicon-germanium, III-V semiconductor compound, etc.), the block copolymer lithography techniques as discussed herein can be utilized to formed self-aligned cut patterns to etch trenches in the semiconductor layer and define an array of vertical semiconductor fins (for FinFET devices) having sub-lithographic width dimensions.

It is to be understood that the patterning methods discussed herein can be incorporated within semiconductor processing flows for fabricating various types of semiconductor devices and integrated circuits having analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method, comprising:
    forming a first layer of material on a substrate;
    forming a second layer of material on the first layer of material;
    forming a brush layer on the second layer of material;
    lithographically patterning the second layer of material and the brush layer to form a guiding pattern, wherein the guiding pattern comprises a plurality of mandrel structures, wherein each mandrel structure comprises a portion of the brush layer on a upper surface thereof;
    performing a directed self-assembly (DSA) process to form a block copolymer pattern, wherein the block copolymer pattern comprises a repeating block chain which comprises at least a first block material and a second block material and a third block material, wherein the first block material and the second block material have etch selectivity with respect to each other;
    wherein the brush layers on the upper surfaces of the mandrel structures provide a wetting surface that is configured to cause an assembly of the third block material on top of each mandrel structure, wherein the third block material constrains the first and second block materials to self-assemble on opposing sides of the third block material in spaces between adjacent mandrel structures;
    selectively etching one of the first block material and the second block material to form self-aligned openings in the block copolymer pattern which expose portions of the first layer of material; and
    patterning the first layer of material by etching the exposed portions of the first layer of material.

2. The method of claim 1, wherein the first block material comprises trimethylsilane (TMS), and wherein the second block material comprises poly(methyl methacrylate) (PMMA).

3. The method of claim 1, wherein the first block material comprises propyltrimethoxysilane (PTMS), and wherein the second block material comprises poly(methyl methacrylate) (PMMA).

4. The method of claim 1, wherein the third block material comprises polystyrene.

5. The method of claim 1, wherein performing the DSA process to form the block copolymer pattern, comprises:
    depositing a multi-block copolymer layer to cover the guiding pattern, wherein the multi-block copolymer layer comprises a mixture of the first block material and the second block material and the third block material; and
    performing a thermal anneal process to phase-separate and self-assemble the first and second and third block materials into the block copolymer pattern.

6. The method of claim 1, wherein the second layer of material comprises a self-planarizing organic material.

7. The method of claim 1, wherein the second layer of material comprises amorphous silicon.

8. The method of claim 1, wherein the first layer of material comprises a hardmask layer.

9. The method of claim 8, wherein patterning the first layer of material comprises forming an etch hardmask, and wherein the method further comprises patterning an inter-level-dielectric (ILD) layer using the etch hardmask to form openings in the ILD layer for metallization.

10. The method of claim 1, wherein the second layer of material is lithographically patterned using extreme ultra-violet (EUV) lithography to form the guiding pattern.

11. The method of claim 1, wherein the first block material and the second block material have an etch selectivity which is about 5:1 or greater.

12. A method, comprising:
    forming a first layer of material on a substrate;
    forming a second layer of material on the first layer of material;
    lithographically patterning the second layer of material to form a guiding pattern, wherein the guiding pattern comprises a plurality of mandrel structures;
    performing a directed self-assembly (DSA) process to form a multi-tone block copolymer pattern;
    wherein the multi-tone block copolymer pattern comprises a repeating block chain comprising a first block material, a second block material, and a third block material;
    wherein the first block material is assembled on upper surfaces of the mandrel structures;
    wherein the second and third block materials are assembled in every other space between adjacent pairs of mandrel structures; and
    wherein the second and third block materials have etch selectivity with respect to each other;
    selectively etching one of the second block material and the third block material to form self-aligned openings in the multi-tone block copolymer pattern which expose portions of the first layer of material; and
    patterning the first layer of material by etching the exposed portions of the first layer of material.

13. The method of claim 12, further comprising recessing the multi-tone block copolymer pattern down to the upper surfaces of the mandrel structures to remove the first block material, prior to the selective etching.

14. The method of claim 12, wherein the first block material comprises polystyrene, wherein the second block material comprises trimethylsilane (TMS), and wherein the third block material comprises poly(methyl methacrylate) (PMMA).

15. The method of claim 12, wherein the second layer of material comprises a self-planarizing organic material.

16. The method of claim 12, wherein the second layer of material comprises amorphous silicon.

17. The method of claim 12, wherein the first layer of material comprises a hardmask layer.

18. The method of claim 17, wherein patterning the first layer of material comprises forming an etch hardmask, and wherein the method further comprises patterning an inter-level-dielectric (ILD) layer using the etch hardmask to form openings in the ILD layer for metallization.

19. The method of claim 12, wherein the second layer of material is lithographically patterned using extreme ultraviolet (EUV) lithography to form the guiding pattern.

* * * * *